US007003051B2

(12) United States Patent
Francos et al.

(10) Patent No.: US 7,003,051 B2
(45) Date of Patent: Feb. 21, 2006

(54) TIME DELAY ESTIMATION IN A TRANSMITTER

(75) Inventors: Amir Francos, Tel-Aviv (IL); Daniel Yellin, Raanana (IL); Eran Gureshnik, Petah-Tikva (IL)

(73) Assignee: Intel Corporation, Santa Clara, CA (US)

( * ) Notice: Subject to any disclaimer, the term of this patent is extended or adjusted under 35 U.S.C. 154(b) by 807 days.

(21) Appl. No.: 09/981,631

(22) Filed: Oct. 16, 2001

(65) Prior Publication Data

US 2003/0072388 A1 Apr. 17, 2003

(51) Int. Cl.
*H04K 25/49* (2006.01)

(52) U.S. Cl. .................................................. 375/296
(58) Field of Classification Search ................ 375/296, 375/278, 284, 358, 371; 330/149; 327/158
See application file for complete search history.

(56) References Cited

U.S. PATENT DOCUMENTS

| 6,741,662 | B1 | | 5/2004 | Francos et al. | |
|---|---|---|---|---|---|
| 6,836,517 | B1 | * | 12/2004 | Nagatani et al. | ............ 375/296 |

FOREIGN PATENT DOCUMENTS

WO WO 01/80471 A2 10/2001

OTHER PUBLICATIONS

James K. Cavers, "Amplifier Linearization Using a Digital Predistorder with Fast Adaptation and Low Memory Requirements," Nov. 1990, IEEE Transactions on Vehicular Technology, vol. 39, 4:374-382.

Wright et al., "Experimental Performance of an Adaptive Digital Linearized Power Amplifier," Nov. 1992, IEEE Transactions of Vehicular Technology, vol. 41, 4:395-400.
Sundström et al., "Effects of Reconstruction Filters in Digital Predistortion Linearizers for RF Power Amplifiers," Feb. 1995, IEEE Transactions on Vehicular Technology, vol. 44, 1:131-139.
Sundström et al., "Quantization Analysis and Design of a Digital Predistortion Linearizer for RF Power Amplifiers," Nov. 1996, IEEE Transactions on Vehicular Technology, vol. 45, 4:707-719.
James K. Cavers, "The Effect of Quadrature Modulator and Demodulator Errors on Adaptive Digital Predistorters for Amplifier Linearization," May 1997, IEEE Transactions on Vehicular Technology, vol. 46, 2:456-466.
James K. Cavers, "New Methods for Adaptation of Quadrature Modulators and Demodulators in Amplifier Linearization Circuits," Aug. 1997, IEEE Transactions on Vehicular Technology, vol. 46, 3:707-716.
James K. Cavers, "Optimum Table Spacing in Predistorting Amplifier Linearizers," Sep. 1999, vol. 48, 5:1699-1705.

* cited by examiner

*Primary Examiner*—Chieh M. Fan
*Assistant Examiner*—Kevin Kim
(74) *Attorney, Agent, or Firm*—Fish & Richardson P.C.

(57) ABSTRACT

In an embodiment, a transmitter section for a mobile device includes a predistorter for predistorting an input signal input to a modulation section. Predistortion values may be selected from a look-up table in response to a fed back signal from the output of the modulation section. A delay between the input signal and the fed back signal may be determined in two stages: a coarse delay estimation for determining a whole number of sample cycles, and a fine delay estimation for determining a fraction of a sample cycle to be added to the coarse delay estimation value.

31 Claims, 5 Drawing Sheets

US 7,003,051 B2

TIME DELAY ESTIMATION IN A TRANSMITTER

BACKGROUND

Radio frequency (RF) transmitters used in mobile phones typically include a power amplifier, which amplifies the signals being transmitted from the phone's antenna. The power amplifier may be operated in its non-linear region near saturation for power efficiency. To avoid distortion of the transmitted signals due to the non-linearity, the signals may be digitally predistorted prior to digital-to-analog (D/A) conversion and up-conversion to the desired carrier frequency.

Digital predistortion may be performed by multiplying the modulated signals prepared for transmission by a set of predistortion values. The predistortion values are chosen such that the product values entering the power amplifier will be distorted by the power amplifier to return to a substantially linear amplification of the modulated signals. This may be achieved by selecting predistortion values that are the approximate inverse of the distortion produced by the non-linear power amplifier.

The predistortion may prevent the transmitter from transmitting signals on channel bands other than the band assigned to the transmitter. Accordingly, it would be advantageous to provide amplification in a linear range of a power amplifier that is adaptable to any channel band.

DETAILED DESCRIPTION

Figure 1:
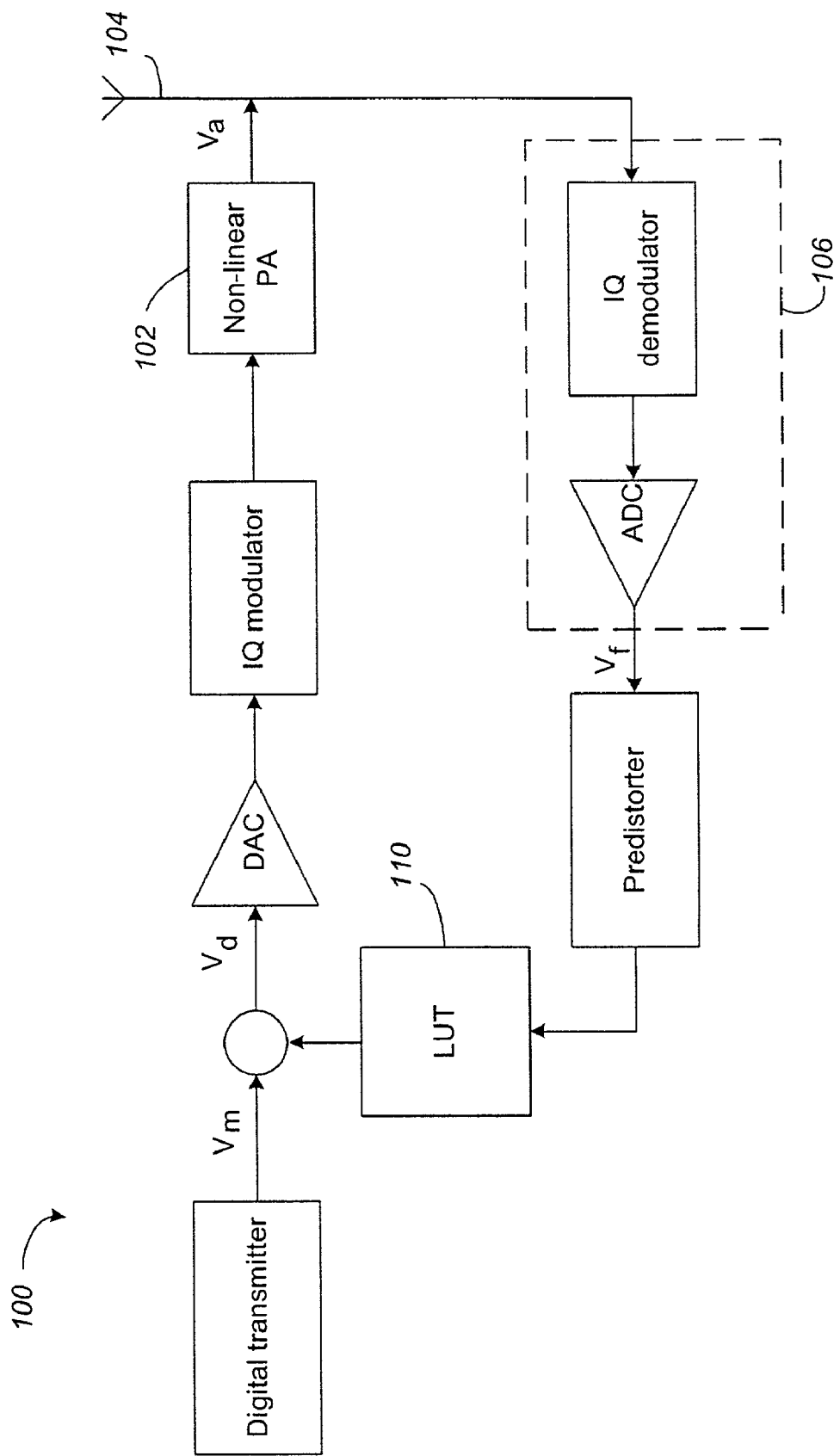
FIG. 1 is a block diagram of a transmitter section according to an embodiment.

FIG. 1 illustrates a transmitter section 100 of a mobile phone according to an embodiment. The transmitter section 100 includes a radio frequency (RF) transmitter and a power amplifier 102 to amplify the signals to be transmitted from an antenna 104. The power amplifier is a non-linear amplifier, which may be, for example, a class AB amplifier operated near saturation for power efficiency.

The transmitted signal may be predistorted in order to reduce spectral spreading and interference with adjacent transmission channels. An analog signal, $V_f$, may be sampled at a feedback path 106 and used to generate predistortion values, which are the approximate inverse of the distortion produced by the non-linear power amplifier 102. The predistortion values may be multiplied with the baseband signal prior to the digital-to-analog (D/A) conversion and up-conversion to the desired carrier frequency. The predistortion values may be stored in a predistortion lookup table (LUT) 110, which is indexed by the amplitude of the multiplied transmitted signal $V_m$.

The returning signal $V_f$ in the feedback path is a delayed version of the input signal $V_m$. The time delay between these two signals may be estimated and compensated in order for the predistortion algorithm to operate properly. In an embodiment, the time delay is estimated in two stages. One stage is a coarse time delay estimate, D, which may be determined at initialization, and which estimates the (whole) number of sample cycles it takes the signal $V_f$ to complete the loop. The other stage is a fine delay estimate, α, which estimates a fraction of the sample cycle over D. The fine delay estimate α may be updated periodically to account for changes in the distortion of the non-linear power amplifier 102 due to, for example, changes in temperature and aging.

Figure 2:
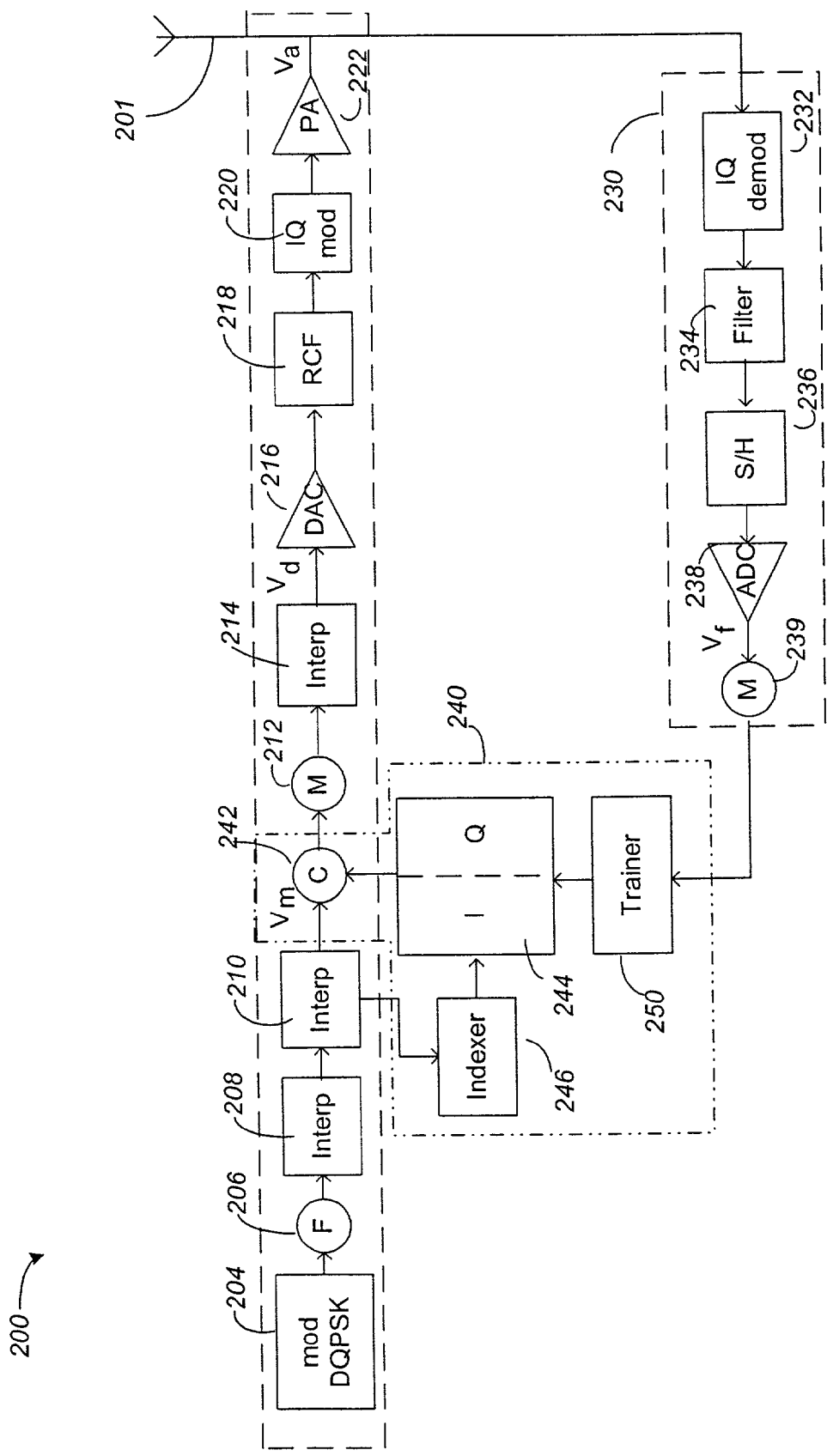
FIG. 2 is a block diagram of transmitter section according to another embodiment.

FIG. 2 illustrates a transmitter section 200 for a Personal Digital Communications (PDC) transmitter, according to an embodiment. The transmitter section 200 includes a predistortion section that limits the adjacent-channel leakage power to about −45 dBc in frequencies 50 kHz off carrier and to about −60 dBc in frequencies 100 kHz off carrier, as specified by the Japanese transmission standard RCR 27R for PCD transmitters.

The transmitter section 200 includes a transmission modulation path 202 which receives digital information and shapes the information for transmission over an antenna 201. The modulation path 202 may include a DQPSK (Differential Quadrature Phase Shifting Key) modulator 204, a frequency correction unit 206, a first interpolator 208, a second interpolator 210, a mismatch multiplier 212, a third interpolator 214, a digital-to-analog converter (DAC) 216, a reconstruction filter (RCF) 218, an IQ modulator 220, and a power amplifier 222.

A feedback path samples the signals transmitted by the power amplifier 222 and passes them through a reversion conversion unit 230, which substantially reverses the operation of the modulation path 202, bringing the signals back to a state ($V_f$) in which they can be compared to the signal $V_m$ provided by the second interpolator 210. The reverse conversion unit 230 may include an IQ demodulator 232 (corresponding to the IQ modulator 220), an anti-aliasing filter 234, a sample-and-hold (S/H) unit 236, an analog-to-digital converter (ADC) 238 (corresponding to the DAC 216), and a mismatch multiplier 239 (corresponding to the mismatch multiplier 212).

A predistorter 240 may be situated between the second interpolator 210 and the mismatch multiplier 212. The predistorter 240 compensates for non-linearities introduced by one or more of the elements of the modulation path, particularly of the power amplifier 222 and the IQ modulator 220. The predistorter 240 may include a complex multiplier 242 and a look up table (LUT) 244, which provides values to be used by the complex multiplier 242. The LUT 244 may include complex numbers formed of real and imaginary parts stored separately, such that each entry of the LUT has a real (I) value and an imaginary (Q) value. For example, the LUT may store 10-bit LUT entries in a 256×2 matrix with I values in one column and Q values in the other column, although various sizes of LUT entries and LUT matrices may be used.

The complex multiplier 242 performs complex multiplications of the complex numbers from the second interpolator 210 with complex numbers from the LUT 244. The predistorter 240 may include an indexer 246, which determines the entry in the LUT to multiply the modulated samples. The indexer may determine the entry of the LUT as the magnitude ($\sqrt{I^2+Q^2}$) of the modulated samples from the second interpolator.

The LUT 244 is populated with initial predistortion values. These initial predistortion values are converged to values suitable for operation in two operations; an initial convergence operation, and an adaptive, or tracking, operation. These operations may be performed by a trainer 250 in the predistorter 240.

Figure 3:
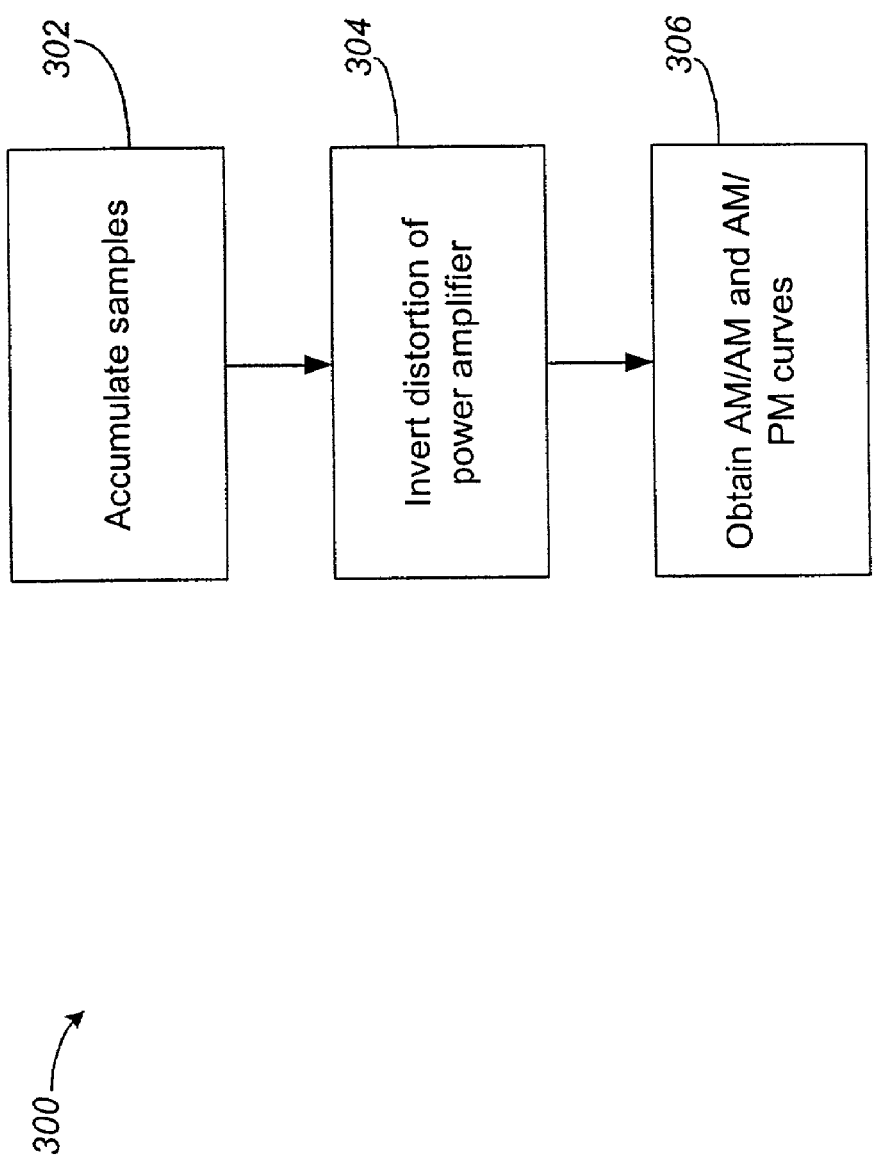
FIG. 3 is a flowchart describing an initial convergence operation according to an embodiment.

FIG. 3 illustrates an exemplary initial convergence operation 300. Samples are accumulated in a memory buffer in the trainer 250 (block 302). The accumulation may be performed over a predetermined amount of time, e.g., over the time of transmitting two data slots, which generally include together a number of samples on the order of the number of entries in the LUT 244. In the RCR 27C standard, for example, two data slots include two hundred eighty samples, slightly more than the 256 entries in the LUT.

Figure 4A:
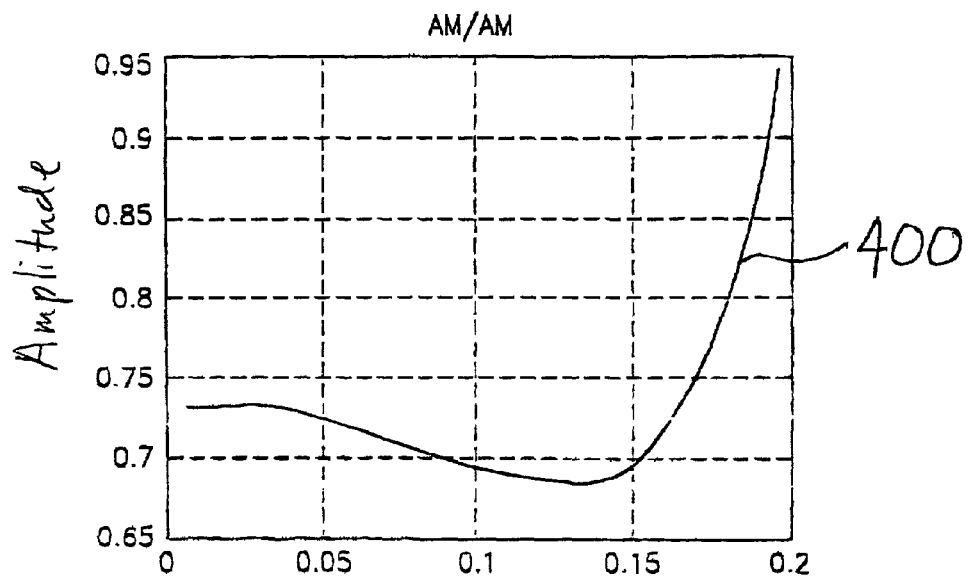
FIG. 4A is an AM/AM curve of a predistorter according to an embodiment.
Figure 4B:
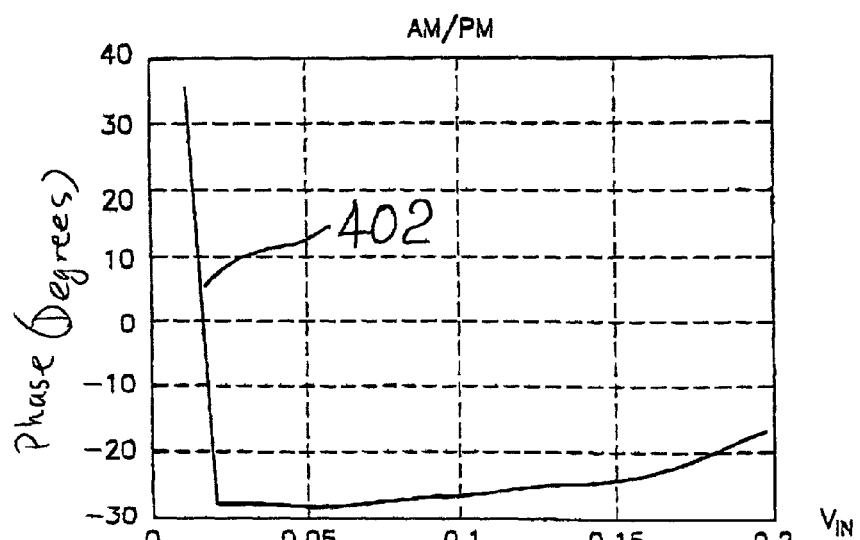
FIG. 4B is an AM/PM curve of a predistorter according to an embodiment.

Based on these samples, the distortion of the power amplifier 222 may be inverted directly (block 304), resulting in Amplitude-to-Amplitude (AM/AM) and Amplitude-to-Phase (AM/PM) curves of the predistorter 240, which are obtained by taking the absolute and angle values of the LUT values, respectively (block 306). The AM/AM curve describes the amplitude compression characteristics of the predistorter, and the AM/PM curve describes the phase distortion characteristics of the predistorter. FIG. 4A is a graph which illustrates an AM/AM curve 400 for the predistorter 240, showing values which multiply the amplitude of the modulated signals from the interpolator 210 as a function of the amplitude of the input signals. FIG. 4B is a graph which illustrates an AM/PM curve 402 for the predistorter, showing values which are added to the phase of the input signals as a function of the amplitude of the input signals.

Since the Personal Digital Communication (PDC) signal has a limited dynamic range, and since not all of the power amplifier input voltage values are met in the first two slots, the LUT 244 may only be partially filled. The rest of the curves may be estimated using least squares polynomial fitting, or other fitting techniques. For example, the AM/AM curve of the predistorter may be represented by the polynomial representation:

$$f(V_{in}, b_{i,1}, b_{i,2}, \ldots b_{i,L}) = b_{i,1}V_{in} + b_{i,2}V_{in}^2 + \ldots b_{i,L}V_{in}^L \quad (1)$$

in which b1, b2, ..., bL are the coefficients of the parametric model. The LS estimate of this curve is given by the equation:

$$\operatorname*{argmin}_{b_{i,k}} \sum_{i=1}^{N} [\bar{f}(V_{in}) - f_i(V_{in}, b_{i,1}, b_{i,2}, \ldots, b_{i,L})]^2 \quad (2)$$

in which N is the number of accumulated pairs of values and $(V_{in}, i, \bar{f}_i(V_{in}))$ are the pairs of accumulated values.

The values in the predistortion LUT 244 obtained at the end of the initial convergence operation 300 may be used as the initial values for a tracking operation. The tracking operation tracks changes in the power amplifier due to, for example, changes in temperature and aging by adaptively updating the contents of the contents of the LUT 244. This updating may reduce the Adjacent Channel Power Ratio (ACPR) level in the transmission.

Adaption of the predistortion is achieved by comparing the fed back amplifier output $V_f(t)$ with the desired amplifier output $KV_m(t)$ and adjusting the predistortion parameters to minimize the following measure of difference:

$$V_{fe}(t) = V_f(t) - KV_m(t), \quad (3)$$

where K is the linear gain factor. Adaption of the predistortion in based on a comparison of paired samples of desired and fed back amplifier outputs. Because the predistortion F (|.|) is constructed as an LUT, only the table entry associated with the magnitude of the input sample $V_m(t)$ is adjusted in response to a given sample pair. A single entry in the LUT may be updated according to the equation:

$$F(V_m, i+1) = F(V_m, i)\left[1 - s\frac{V_{fe}(i)}{V_f(i)}\right] \quad (4)$$

where s<<1 and is positive (e.g., between 0.1 and 0.25). A specific table entry may only be updated when the input signal $V_m$ amplitude passes through it, which occurs at unpredictable times.

Figure 5:
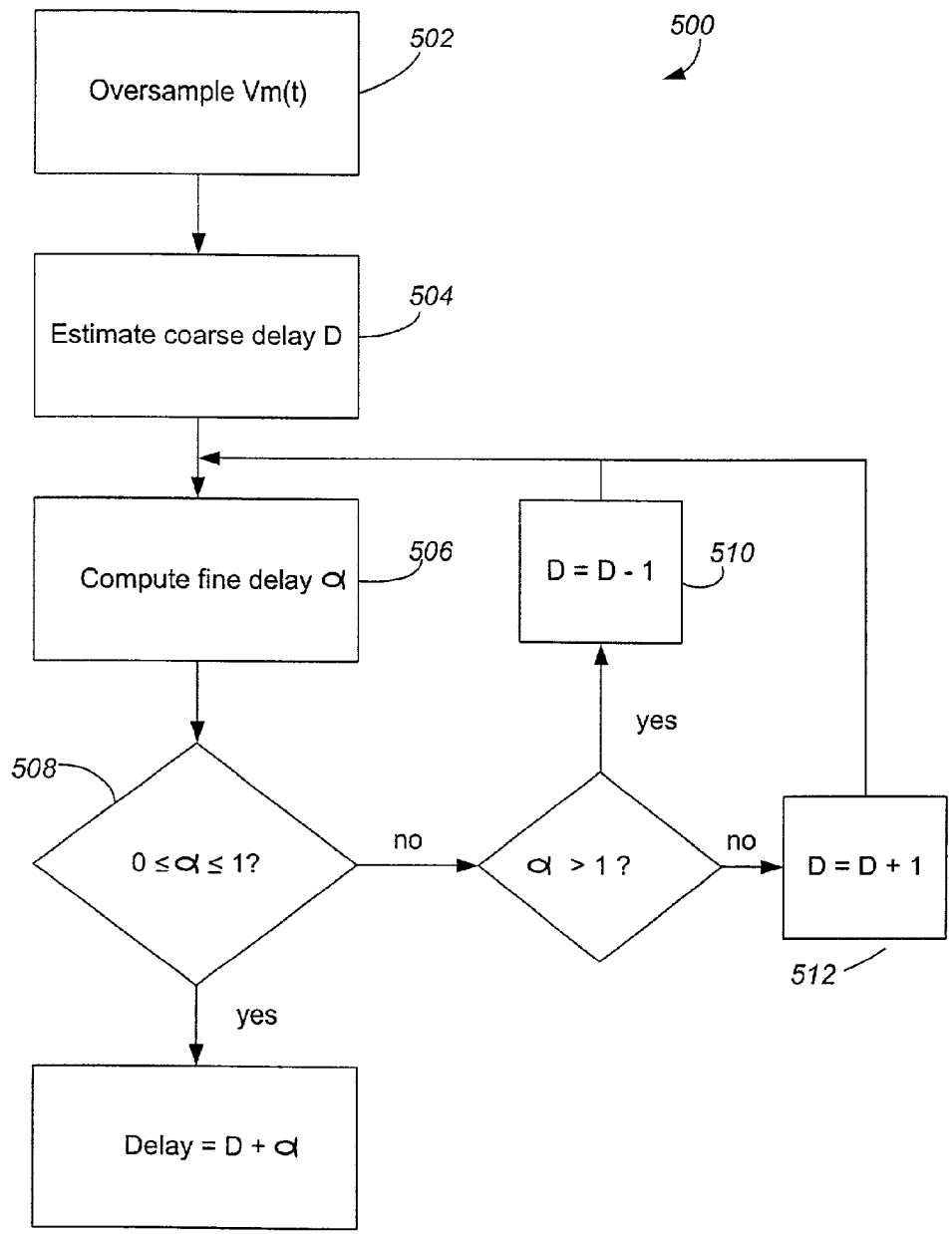
FIG. 5 is a flowchart describing a time delay estimation operation according to an embodiment.

As described above, the sampled signal at the feedback path $V_f(t)$ is a delayed version of the input signal $V_m(t)$. FIG. 5 is a flowchart describing a delay estimation operation 500 according to an embodiment. A coarse estimate D may be made of the delay using correlation, and a fine correlation estimate $\alpha$ may be made using linear interpolation techniques. The coarse delay estimate D is an estimate of the number of samples it takes for the signal $V_m(t)$ at the input to the complex multiplexer to pass the entire loop. Since the predistorter 240 and power amplifier 222 may be assumed to be memoryless, in the present embodiment, the loop filters are a main source for the delay. In the transmitter section of FIG. 2, the loop filters include the second interpolator 210, which is a digital filter, and the RCF filter 218 and the anti-aliasing filter 234, which are both analog filters. The delay of the digital filter can be computed. The delay of the analog filters may be much more difficult to calculate, if calculable at all, and may vary, e.g., with temperature.

The input signal to the loop $V_m(t)$ may be oversampled (block 502). In the present embodiment, the sampling rate is thirty-two samples per symbol. The returning signal $V_f(t)$ is delayed by D samples, where D can assume any value between 1 and 32. D may be estimated using the following correlation:

$$D = \arg\max_{d}\{Corr(V_m(t-d), V_f(t))\} \quad (5)$$

and $$Corr(V_m(t), V_f(t)) = C(n) = \frac{1}{N-d}\sum_{n=d+1}^{N-1} V_m(n-d)V_f^*(n) \quad (6)$$

A correlator bank including thirty-two entries may be generated, and the maximal value of the correlation selected to coarsely estimate the delay (block 504). It may be necessary to calculate the coarse delay estimate D only once, for example, during the initial convergence operation.

The true delay may be a fraction which lies between D and D+1, and expressed by the equation $$V_f(t) = aV_m(t-D) + (1-a)V_m(t-D-1), \quad 0 \leq a \leq 1 \quad (7)$$

The fine delay estimate a may be computed (block 506) from the equation:

$$a = \operatorname*{argmin}_{a}\{|V_f(t) - [aKV_m(t-D) + (1-a)KV_m(t-D-1)]|^2\} \quad (8)$$

To find the value of α, denote:

$$Z(t) \equiv K[V_m(t-D-1) - V_m(t-D)] \quad (9)$$

and $$X(t) \equiv V_f(t) - KV_m(t-D-1) \quad (10)$$

The equation that minimizes Equation 8 is:

$$a = -\frac{\sum_{t=1}^{N} Z^*(t)X(t) + Z(t)X^*(t)}{2\sum_{t=1}^{N} Z(t)Z^*(t)} = -\frac{\sum_{t=1}^{N} \Re\{Z^*(t)X(t)\}}{\sum_{t=1}^{N} |Z(t)|^2} \quad (11)$$

If $0 \leq \alpha \leq 1$, α may be used as the fine delay factor (block 508). If α>1, D is set to "D−1" (block 510) and α may be re-computed using Equation 10. If α<0, D is set to "D+1" (block 512) and α may be re-computed using Equation 11.

In the PDC embodiment, the fine delay factor α may be computed using a data buffer of sixty symbols. The fine delay factor α may be computed after the third or fourth slot using the value of D determined in the second slot. Since the delay factor may change due to, for example, changes in temperature and aging, it may be desirable to recalculate α periodically.

A number of embodiments have been described. Nevertheless, it will be understood that various modifications may be made without departing from the spirit and scope of the invention. For example, blocks in the operations described in the various flowcharts may be skipped or performed in a different order and still produce desirable results. Accordingly, other embodiments are within the scope of the following claims.

The invention claimed is:

1. A method comprising:
    calculating a first delay value representing an estimated delay between an input signal and a fed back signal, said first delay value comprising a whole number of sample cycles;
    calculating a second delay value from said first delay value, said second delay value comprising a fraction of a sample cycle; and
    adding the first delay value and the second delay value to generate a third delay value representing a more precise estimated delay between the input signal and the fed back signal.

2. The method of claim 1, wherein said calculating the first delay value comprises oversampling the input signal.

3. The method of claim 2, wherein the input signal is oversampled at a sampling rate of thirty-two samples per symbol, and wherein the first delay value comprises a whole number between one and thirty-two.

4. The method of claim 2, wherein said calculating the first delay value further comprises solving the equation:

$$D = \operatorname*{argmax}_{d}\{Corr(V_m(t-d), V_f(t))\}$$

where $$Corr(V_m(t), V_f(t)) = C(n) = \frac{1}{N-d} \sum_{n=d+1}^{N-1} V_m(n-d)V_f^*(n)$$

where D is the first delay value, $V_m$ is the input signal, and $V_f$ is the fed back signal.

5. The method of claim 1, wherein said calculating the second delay value comprises solving the equation $$a = -\frac{\sum_{t=1}^{N} Z^*(t)X(t) + Z(t)X^*(t)}{2\sum_{t=1}^{N} Z(t)Z^*(t)} = -\frac{\sum_{t=1}^{N} \Re\{Z^*(t)X(t)\}}{\sum_{t=1}^{N} |Z(t)|^2}$$

where $$Z(t) \equiv K[V_m(t-D-1) - V_m(t-D)]$$

where $$X(t) \equiv V_f(t) - KV_m(t-D-1)$$

where K is the linear gain factor, D is the first delay value, $V_m$ is the input signal, and $V_f$ is the fed back signal.

6. The method of claim 1, further comprising decrementing the first delay value by one and recalculating the second delay value with the decremented first delay value in response to the second delay value being less than one.

7. The method of claim 1, further comprising incrementing the first delay value by one and recalculating the second delay value with the incremented first delay value in response the to the second delay value being greater than one.

8. The method of claim 1, further comprising modulating the input signal for transmission from a Personal Digital Communications (PDC) transmitter.

9. The method of claim 8, further comprising calculating the first delay value in two slots.

10. The method of claim 8, further comprising calculating the second delay value in four slots.

11. An apparatus comprising:
    a modulation path having an input operative to receive an input signal, said modulation path operative to modulate said input signal and output a modulated signal for transmission;
    a feedback path operative to generate a feedback signal from the modulated signal; and
    a predistorter connected between the feedback path and the input of the modulation path, said predistorter comprising a delay estimator operative to
        calculate a first delay value representing an estimated delay between the input signal and the feedback signal, said first delay value comprising a whole number of sample cycles,
        calculate a second delay value from said first delay value, said second delay value comprising a fraction of a sample cycle, and
        add the first delay value and the second delay value to generate a third delay value representing a more precise estimated delay between the input signal and the feedback signal.

12. The apparatus of claim 11, further comprising a look-up table connected between the predistorter and the input of the modulation path, said look-up table including a plurality of predistortion values.

13. The apparatus of claim 12, further comprising a PDC transmitter section.

14. The apparatus of claim 12, wherein the lock-up table comprises a 256×2 array.

15. The apparatus of claim 12, wherein the predistorter is operative to generate the first delay value within two slots.

16. The apparatus of claim 12, wherein the predistorter is operative to generate the second delay value within four slots.

17. A article comprising a machine-readable medium which stores machine-executable instructions, the instructions causing a machine to:
calculate a first delay value representing an estimated delay between an input signal and a fed back signal, said first delay value comprising a whole number of sample cycles;
calculate a second delay value from said first delay value, said second delay value comprising a fraction of a sample cycle; and
add the first delay value and the second delay value to generate a third delay value representing a more precise estimated delay between the input signal and the fed back signal.

18. The article of claim 17, wherein the instructions causing the machine to calculate the first delay value comprise instructions causing the machine to oversample the input signal.

19. The article of claim 18, wherein the input signal is oversampled at a sampling rate of thirty-two samples per symbol, and wherein the first delay value comprises a whole number between one and thirty-two.

20. The article of claim 18, wherein the instructions causing the machine to calculate the first delay value further comprise instructions causing the machine to solve the equation:

$$D = \arg\max_d \{Corr(V_m(t-d), V_f(t))\}$$

where $$Corr(V_m(t), V_f(t)) = C(n) = \frac{1}{N-d} \sum_{n=d+1}^{N-1} V_m(n-d) V_f^*(n)$$

where D is the first delay value, Vm is the input signal, and Vf is the fed back signal.

21. The article of claim 17, wherein the instructions causing the machine to calculate the second delay value further comprise instructions causing the machine to solve the equation:

$$a = -\frac{\sum_{t=1}^{N} Z^*(t)X(t) + Z(t)X^*(t)}{2\sum_{t=1}^{N} Z(t)Z^*(t)} = -\frac{\sum_{t=1}^{N} R\{Z^*(t)X(t)\}}{\sum_{t=1}^{N} |Z(t)|^2}$$

where $$Z(t) = K[V_m(t-D-1) - V_m(t-D)]$$

where $$X(t) = V_f(t) - KV_m(t-D-1)$$

where K is the linear gain factor, D is the first delay value, Vm is the input signal, and Vf is the fed back signal.

22. The article of claim 17, further comprising instructions causing the machine to decrement the first delay value by one and recalculate the second delay value with the decremented first delay value in response to the second delay value being less than one.

23. The article of claim 17, further comprising instructions causing the machine to increment the first delay value by one and recalculate the second delay value with the incremented first delay value in response to the second delay value being greater than one.

24. The article of claim 17, further comprising instructions causing the machine to modulate the input signal for transmission from a Personal Digital Communications (PDC) transmitter.

25. The article of claim 24, further comprising instructions causing the machine to calculate the first delay value in two slots.

26. The article of claim 24, further comprising instructions causing the machine to calculate the second delay value in four slots.

27. A system comprising:
an antenna;
a modulation path having an input operative to receive an input signal, said modulation path operative to modulate said input signal and output a modulated signal for transmission from the antenna;
a feedback path operative to generate a feedback signal from the modulated signal; and
a predistorter connected between the feedback path and the input of the modulation path, said predistorter comprising a delay estimator operative to
calculate a first delay value representing an estimated delay between the input signal and the feedback signal, said first delay value comprising a whole number of sample cycles,
calculate a second delay value from said first delay value, said second delay value comprising a fraction of a sample cycle, and
add the first delay value and the second delay value to generate a third delay value representing a more precise estimated delay between the input signal and the feedback signal.

28. The system of claim 27, further comprising a look-up table connected between the predistorter and the input of the modulation path, said look-up table including a plurality of predistortion values.

29. The system of claim 28, further comprising a PDC transmitter section.

30. The system of claim 28, wherein the predistorter is operative to generate the first delay value within two slots.

31. The system of claim 28, wherein the predistorter is operative to generate the second delay value within four slots.

* * * * *